United States Patent

Sakaki et al.

Patent Number: 5,804,474
Date of Patent: Sep. 8, 1998

[54] METHOD FOR FORMING A V-SHAPED GATE ELECTRODE IN A SEMICONDUCTOR DEVICE, AND THE STRUCTURE OF THE ELECTRODE

[75] Inventors: Hidehiko Sakaki, Moriyama; Yasushi Yokoi, Shiga-ken; Koji Monden, Omihachiman, all of Japan

[73] Assignee: Murata Manufacturing Co., Ltd., Japan

[21] Appl. No.: 820,507

[22] Filed: Apr. 4, 1997

[30] Foreign Application Priority Data

Apr. 10, 1996 [JP] Japan .................................. 8-088010

[51] Int. Cl.[6] ..................... H01L 21/338; H01L 21/3205; H01L 21/4763; G03C 5/00
[52] U.S. Cl. ..................... 438/167; 438/182; 438/585; 438/949; 438/951; 430/315; 430/329; 430/330
[58] Field of Search ..................... 430/315, 329, 430/330; 438/585, 951, 182, 183, 949, 167

[56] References Cited

U.S. PATENT DOCUMENTS

| | | |
|---|---|---|
| 4,253,888 | 3/1981 | Kikuchi . |
| 4,497,684 | 2/1985 | Sebesta . |
| 5,171,718 | 12/1992 | Ishibashi et al. . |
| 5,300,403 | 4/1994 | Angelopolus et al. .................. 430/325 |
| 5,432,125 | 7/1995 | Misawa et al. . |
| 5,496,779 | 3/1996 | Lee et al. . |
| 5,583,063 | 12/1996 | Samoto . |
| 5,648,198 | 7/1997 | Shibata ..................................... 430/296 |

*Primary Examiner*—John Niebling
*Assistant Examiner*—Richard A. Booth
*Attorney, Agent, or Firm*—Ostrolenk, Faber, Gerb & Soffen, LLP

[57] ABSTRACT

A method for forming a V-shaped gate electrode on a semiconductor substrate includes the following steps: A first gate opening is formed in a first resist between a source and a drain formed on a semiconductor substrate, and dummy openings are formed near both sides of the first gate opening. By baking the first resist, convex portions thereof which rise steeply are formed between the first gate opening and the dummy openings. A second resist is formed to overlay the first resist convex portions and the first gate opening. The second resist is removed from the first gate opening, and a second gate opening larger than the first gate opening is formed in the second resist above the first gate opening. Metal for the V-shaped gate electrode is deposited through the second gate opening on the sides of the first resist convex portions rising steeply from the bottom of the first gate opening. A lift-off technique is performed to leave the V-shaped gate electrode by dissolving the first resist convex portions and the second resist.

9 Claims, 2 Drawing Sheets

METHOD FOR FORMING A V-SHAPED GATE ELECTRODE IN A SEMICONDUCTOR DEVICE, AND THE STRUCTURE OF THE ELECTRODE

BACKGROUND OF THE INVENTION

1. Field of the Invention

The present invention relates to a method for forming a V-shaped gate electrode in a semiconductor device, and the structure of the V-shaped gate electrode.

2. Description of the Related Art

To improve the performance of a field-effect transistor or the like, the length of a gate electrode needs to be reduced. However, simply making the gate electrode thin increases the gate resistance, which increasingly deteriorates the transistor characteristics. Accordingly, a V-shaped gate electrode structure has been used in which the gate length is reduced and the gate cross-sectional area is enlarged to prevent an increase in the gate resistance.

FIGS. 2A to 2G show a conventional method for forming a V-shaped gate electrode with two resist layers.

As shown in FIG. 2A, a source/drain electrode 2 is formed on a semiconductor substrate 1, a first resist 3 is subsequently formed, and exposure light 5 is emitted through a photomask 4 to expose the first resist 3. As shown in FIG. 2B, a first gate opening 6 is subsequently formed by developing the exposed first resist 3.

Successively, as shown in FIG. 2C, the first resist 3 is baked at, for example, 180° C. for 3 minutes, to form rounded surfaces at the gate opening 6, and as shown in FIG. 2D, a second resist 7 is formed, and exposure light 9 is emitted through a photomask 8 to expose the second resist 7. Subsequently, as shown in FIG. 2E, a second gate opening 10 is formed in the second resist 7.

Finally, as shown in FIG. 2F, gate electrode metal 11 is deposited on the overall surface of the second resist 7, and in the second gate opening 10, and subsequently, as shown in FIG. 2G, by using a lift-off technique for dissolving the first resist 3 and the second resist 7, the gate electrode metal 11 is revealed to produce a V-shaped gate electrode 12.

According to the above method, it is essential to bake the first resist 3 to cure it (the step shown in FIG. 2C) after patterning the first resist 3 so that the width of the first gate opening 6 in the first resist 3 remains constant throughout the baking step.

However, the baking step causes deformation of the first resist 3, which greatly affects the shape of the finally obtained gate electrode. In other words, a rise angle β (shown in FIG. 2G) of the gate electrode is determined by the shape of the first resist 3. Thus, as the first resist 3 becomes more deformed, the rise angle β decreases, so the distance between the gate electrode 11 and the semiconductor substrate 1 narrows.

The space between the V-shaped gate electrode 12 and the semiconductor substrate 1 has capacitance, which is so-called parasitic capacitance. Thus, enlarging the distance between the gate electrode 12 and the semiconductor substrate 1 reduces parasitic capacitance to improve transistor characteristics such as the cut-off frequency, and so forth. In other words, the deformation of the first resist 3 increases parasitic capacitance, so as to deteriorate the transistor characteristics.

To prevent the deformation of the first resist 3, it is possible to use an ultraviolet curing technique which emits ultraviolet light toward the first resist 3 to cure it in advance after the step shown in FIG. 2B. However, the ultraviolet curing technique is not preferable because it requires expensive equipment and a long processing time, which increases the cost of producing semiconductor devices.

SUMMARY OF THE INVENTION

Accordingly, it is an advantage of the present invention that it provides a method for forming a V-shaped gate electrode using only two resist layers, which prevents deformation of a first resist, and readily forms a V-shaped gate electrode having reduced parasitic capacitance.

To this end, according to a first aspect of the present invention, the V-shaped gate electrode is formed on a semiconductor substrate by forming a first gate opening in a first resist between a source and a drain formed on the semiconductor substrate, and dummy openings are formed in proximity to both sides of the first gate opening.

According to a second aspect of the present invention, the V-shaped gate electrode is formed on a semiconductor substrate by forming a first gate opening in a first resist between a source and a drain formed on the semiconductor substrate, and forming dummy openings in proximity to both sides of the first gate opening; forming first resist convex portions rising steeply between the first gate opening and the dummy openings by baking the first resist; forming a second resist to overlay the first resist convex portions and the first gate opening; removing the second resist above the first gate opening, and forming a second gate opening larger than the first gate opening in the second resist above the first gate opening; depositing metal for the V-shaped gate electrode through the second gate opening on the sides of the first resist convex portions rising steeply from the bottom of the first gate opening; and performing a lift-off technique for leaving the V-shaped gate electrode by dissolving the first resist convex portions and the second resist.

Preferably, the first gate opening, formed between a pair of the first resist convex portions after the first resist is baked, is shaped so that the gate electrode, formed by deposition on the sides of the first resist convex portions from the bottom of the first gate opening, is roughly V-shaped.

According to a third aspect of the present invention, a field-effect transistor has a roughly V-shaped gate electrode which has a rise angle of 45 degrees or more with respect to the surface of the semiconductor surface.

According to the first and second aspects of the present invention, by forming the dummy openings in proximity to both sides of the first gate opening, deformation of the first resist can be prevented, and the first resist convex portions can be formed rising steeply between the first gate opening and the dummy openings. Thus, it is possible to form the final V-shaped gate electrode with a large rise angle with respect to the surface of the semiconductor substrate.

The second resist may be baked before and/or after formation of the second gate opening. The baking of the second resist is preferably at a temperature lower than a temperature at which the first resist is baked, to prevent intermixing of the first resist and the second resist while they are being baked, and to prevent additional deformation of the first resist.

According to the third aspect of the present invention, in the field-effect transistor in which the V-shaped gate electrode has a rise angle of 45 degrees or more with respect to the surface of the semiconductor surface, the distance between the gate electrode and the semiconductor substrate can be increased, so that parasitic capacitance can be reduced, and a field-effect transistor with preferable characteristics such as its cut-off frequency and so forth can be obtained.

DESCRIPTION OF AN EMBODIMENT OF THE INVENTION

Figure 1A:
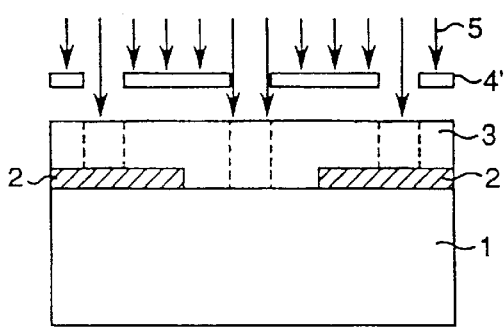
FIGS. 1A to 1G are charts illustrating a process for forming a V-shaped gate electrode using two resist layers according to an embodiment of the present invention.

FIGS. 1A to 1G show one embodiment of the present invention. The same reference numerals as those in FIGS. 2A to 2G denote the same or corresponding portions.

As shown in FIG. 1A, after a source/drain electrode 2 is formed on a semiconductor substrate 1, for example, a positive photoresist such as PFi26A (produced by Sumitomo Chemical Co., Ltd.) is coated to be approximately 1 $\mu$m thick by spin coating, and the coated photoresist is baked at 90° C. for 90 seconds to form a first resist 3. Successively, by using an I-line stepper to emit exposure light 5 onto the first resist 3 through a photo mask 4' having a gate pattern and a dummy pattern with a pattern width of 0.5 $\mu$m, the first resist 3 is exposed.

Figure 1E:
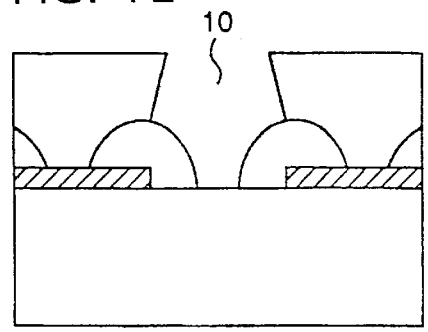
Figure 1B:
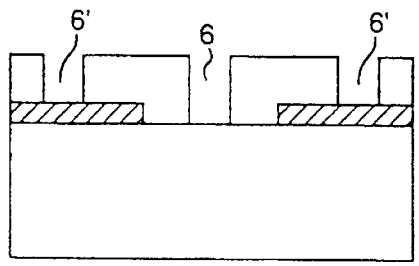

Subsequently, as shown in FIG. 1B, by developing the first resist 3 with an ordinary alkaline developer (for example, SD-1 produced by Tokuyamasotatsu Co., Ltd.), a first gate opening 6 and dummy openings 6' are formed in the first resist 3. In order to prevent deformation of the resist while being baked during a successive step as shown in FIG. 1C by utilizing surface tension, the first resist pattern is formed so that, for example, when the first gate opening 6 is 0.5 $\mu$m wide, the distance between the first gate opening 6 and each dummy opening 6' is appropriately set to approximately 3 $\mu$m. The width of the dummy opening 6' may be arbitrary.

Figure 1F:
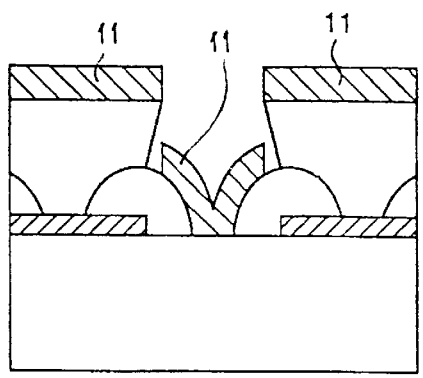
Figure 1C:
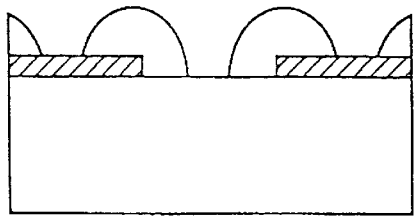
Figure 2A:
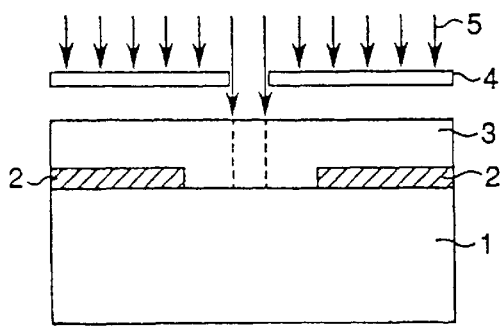
FIGS. 2A to 2G are charts illustrating a conventional process for forming a V-shaped gate electrode using two resist layers.
Figure 2E:
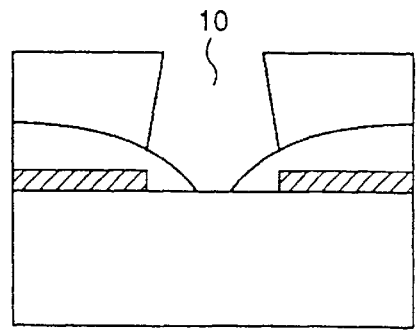
Figure 2B:
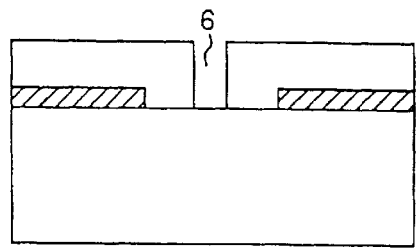
Figure 2C:
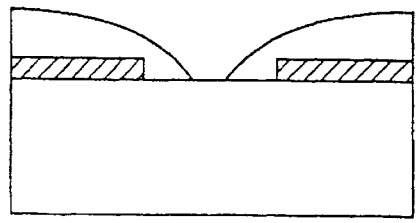
Figure 2F:
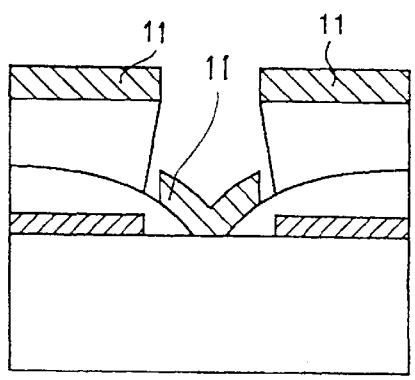
Figure 2D:
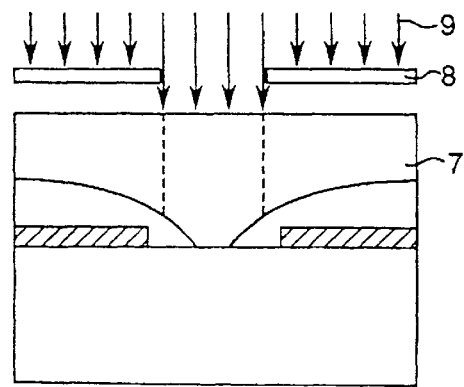
Figure 2G:
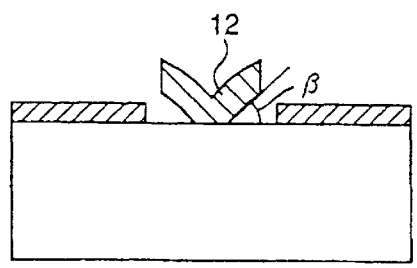

As shown in FIG. 1C, the first resist 3 is baked. The first resist 3 is appropriately baked by an air-circulating oven at 180° C. for 15 minutes or by a hot plate at 180° C. for 3 minutes. The baking softens the first resist 3, but its surface tension forms convex shapes (FIG. 1C) which rise steeply between the first gate opening and the dummy openings, which does not cause the conventional large deformation as shown in FIG. 2C.

The following Table 1 shows relationships of the thickness of the first resist 3 and the distance between the first gate opening 6 and the dummy openings 6' with respect to a rise angle a in a V-shaped gate electrode when the first gate opening 6 is 0.5 $\mu$m wide.

As apparent from the following Table 1, by controlling the thickness of the first resist 3 and the distance between the first gate opening 6 and the dummy openings 6', the rise angle $\alpha$ in the V-shaped gate electrode can be controlled to have excellent values of at least 65° and even up to substantially 90°.

When the gate electrode was formed without the dummy openings 6' under the same conditions as those in Table 1, the rise angle $\alpha$ was 25°.

TABLE 1

| THICKNESS OF FIRST RESIST ($\mu$m) | DISTANCE BETWEEN GATE OPENING AND DUMMY OPENING ($\mu$m) | RISE ANGLE $\alpha$ (°) |
| --- | --- | --- |
| 1 | 2 | 90 |
| 1 | 3 | 80 |
| 1 | 4 | 65 |

Figure 1D:
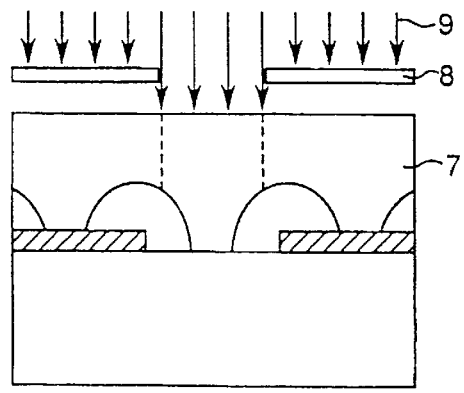

Subsequently, as shown in FIG. 1D, similar to the conventional method, a second resist 7 is formed so as to include the first gate opening and to overlay the first resist convex portions which rise steeply, and exposure light 9 is emitted through a photomask 8 to expose the second resist 7. The second resist 7 preferably has an overhang shape (FIG. 1E), with which a lift-off technique is easily performed after development, so the second resist 7 is preferably comprised of AZ5214E (produced by Hoechst Ltd.) with which the overhang shape is easily obtained.

The second resist may be baked just before and/or just after the light exposure step, preferably at a temperature lower than the baking temperature of the first resist.

As shown in FIG. 1E, by a conventional development process, a second gate opening 10 which is larger than the first gate opening 6 is formed on the second resist 7 above the first gate opening 6. As mentioned above, the second resist 7 preferably has the overhang shape.

Successively, as shown in FIG. 1F, gate electrode metal 11 is formed through the second gate opening 10 by vacuum deposition on the sides of the convex portions of the first resist 3 which rise steeply from the bottom of the first gate opening 6. The gate electrode metal 11 comprises a Ti layer 1000 Å thick, a Pt layer 500 Å thick and an Au layer 3000 Å thick, preferably deposited in that order.

Figure 1G:
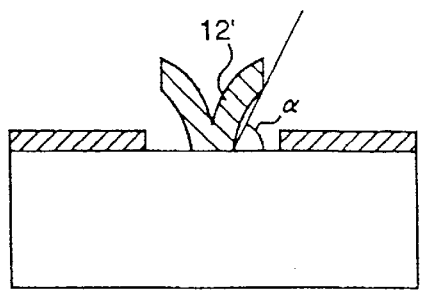

Finally, as shown in FIG. 1G, by the so-called lift-off technique, the first resist 3 and the second resist 7 are dissolved and removed using an organic solvent or the like, and the gate electrode metal 11 is revealed to provide a V-shaped gate electrode 12' which has a larger rise angle compared with the conventional structure.

According to this embodiment, deformation of a first resist 3 by the baking process can be prevented. The first resist 3 after being baked can have a convex shape which rises steeply between the first gate opening 6 and each of the dummy openings 6', and the rise angle $\alpha$ of the finally obtained V-shaped gate electrode can be increased more than the rise angle $\beta$ of the conventional V-shaped gate electrode. As a result, a lower parasitic capacitance is generated between the semiconductor substrate 1 and the gate electrode 12'. In addition, the process according to this embodiment does not require an expensive ultraviolet curing method. Thus, the above-described advantages can be obtained at the same cost as that in the conventional manufacturing process.

What is claimed is:
1. A method for forming a V-shaped gate electrode on a semiconductor substrate, comprising the steps of:
   forming a first resist covering said semiconductor substrate and a source and a drain formed thereon;
   forming a first gate opening in said first resist between said source and said drain on said semiconductor substrate;
   forming dummy openings in proximity to both sides of said first gate opening; and
   depositing metal on said semiconductor substrate, while utilizing said first gate opening and said dummy open- ings to guide said depositing of metal, to form said V-shaped gate electrode.

2. A method for forming a V-shaped gate electrode on a semiconductor substrate, comprising the steps of:

forming a first gate opening on a first resist between a source and a drain formed on said semiconductor substrate, and forming dummy openings in proximity to both sides of said first gate opening;

forming first resist convex portions rising steeply between said first gate opening and said dummy openings by baking said first resist;

forming a second resist to overlay the first resist convex portions and said first gate opening;

removing said second resist above said first gate opening, and forming a second gate opening larger than said first gate opening in said second resist above said first gate opening;

depositing metal for said V-shaped gate electrode on the sides of the first resist convex portions rising steeply from the bottom of said first gate opening through said second gate opening; and performing a lift-off technique for leaving said V-shaped gate electrode by dissolving the first resist convex portions and said second resist.

3. A method for forming a V-shaped gate electrode according to claim 2, wherein said first gate opening, formed between a pair of said first resist convex portions after said first resist is baked, is shaped so that said gate electrode, formed by deposition of metal on the sides of the first resist convex portions from the bottom of said first gate opening, is generally V-shaped.

4. A method for forming a V-shaped gate electrode according to claim 3, wherein said second resist is baked at a temperature lower than a temperature at which said first resist is baked.

5. A method for forming a V-shaped gate electrode according to claim 2, wherein said second resist is baked at a temperature lower than a temperature at which said first resist is baked.

6. A method for forming a V-shaped gate electrode according to claim 1, wherein said gate electrode has a rise angle of 45 degrees or more with respect to said semiconductor substrate.

7. A method for forming a V-shaped gate electrode according to claim 6, wherein said rise angle is 65 degrees or more.

8. A method for forming a V-shaped gate electrode according to claim 2, wherein said gate electrode has a rise angle of 45 degrees or more with respect to said semiconductor substrate.

9. A method for forming a V-shaped gate electrode according to claim 8, wherein said rise angle is 65 degrees or more.

* * * * *